US 6,609,869 B2

(12) United States Patent
Aggarwal et al.

(10) Patent No.: US 6,609,869 B2
(45) Date of Patent: Aug. 26, 2003

(54) TRANSFER CHAMBER WITH INTEGRAL LOADLOCK AND STAGING STATION

(75) Inventors: Ravinder Aggarwal, Gilbert, AZ (US); James F. Kusbel, Fountain Hills, AZ (US)

(73) Assignee: ASM America, Phoenix, AZ (US)

( * ) Notice: Subject to any disclaimer, the term of this patent is extended or adjusted under 35 U.S.C. 154(b) by 0 days.

(21) Appl. No.: 09/754,571

(22) Filed: Jan. 4, 2001

(65) Prior Publication Data

US 2002/0085899 A1 Jul. 4, 2002

(51) Int. Cl.[7] .............................................. B65G 49/07
(52) U.S. Cl. ...................................... 414/217; 414/805
(58) Field of Search .................................. 414/935, 936, 414/938, 939, 940, 217, 287, 416.03, 804, 805

(56) References Cited

U.S. PATENT DOCUMENTS

| 4,949,783 | A |   | 8/1990  | Lakios et al. |
|-----------|---|---|---------|---------------|
| 5,199,483 | A |   | 4/1993  | Bahng |
| 5,229,615 | A | * | 7/1993  | Brune et al. ................ 250/398 |
| 5,391,035 | A |   | 2/1995  | Krueger |
| 5,516,732 | A | * | 5/1996  | Flegal, deceased ........ 29/25.01 |
| 5,520,742 | A |   | 5/1996  | Ohkase |
| 5,788,447 | A | * | 8/1998  | Yonemitsu et al. ......... 414/217 |
| 5,855,681 | A |   | 1/1999  | Maydan et al. |
| 5,879,459 | A | * | 3/1999  | Gadgil et al. ............... 118/715 |
| 5,882,165 | A |   | 3/1999  | Maydan et al. |
| 5,882,413 | A |   | 3/1999  | Beaulieu et al. |
| 5,883,017 | A |   | 3/1999  | Tepman et al. |
| 5,897,710 | A | * | 4/1999  | Sato et al. ................... 414/217 |
| 5,900,105 | A |   | 5/1999  | Toshima |
| 5,934,856 | A | * | 8/1999  | Asakawa et al. ........... 414/217 |
| 5,970,717 | A |   | 10/1999 | Tateyama |
| 5,974,682 | A |   | 11/1999 | Akimoto |
| 5,975,740 | A |   | 11/1999 | Lin et al. |
| 6,000,227 | A |   | 12/1999 | Kroeker |
| 6,042,623 | A | * | 3/2000  | Edwards ................. 204/298.26 |
| 6,045,315 | A | * | 4/2000  | Azumano et al. ........... 414/217 |
| 6,053,686 | A | * | 4/2000  | Kyogoku ..................... 414/217 |
| 6,053,980 | A | * | 4/2000  | Suda et al. .................. 118/719 |
| 6,071,055 | A | * | 6/2000  | Tepman ...................... 414/217 |
| 6,073,366 | A | * | 6/2000  | Aswad .......................... 34/367 |
| 6,108,937 | A |   | 8/2000  | Raaijmakers |
| 6,162,299 | A | * | 12/2000 | Raaijmakers ............... 118/719 |

FOREIGN PATENT DOCUMENTS

EP    1 139 393 A2    10/2001
WO    94/14185    7/1994

\* cited by examiner

Primary Examiner—Christopher P. Ellis
Assistant Examiner—Charles A. Fox
(74) Attorney, Agent, or Firm—Knobbe, Martens, Olson & Bear, LLP

(57) ABSTRACT

A substrate processing system includes a substrate handling chamber and an integrated load lock chamber. The load lock chamber has a gated inlet for the transfer of a substrate into and out of the load lock chamber and a gated port for transferring a substrate between the load lock chamber and the substrate handling chamber. The substrate handling chamber includes a staging shelf that is positioned above the load lock chamber and a substrate handler for moving a substrate between the load lock chamber and the staging shelf. In use, a first substrate is placed at a load lock station that is located inside the load lock chamber. The first substrate is moved from the load lock station to a staging shelf located inside the substrate handling chamber. A second substrate is moved from a cooling station in the substrate handling chamber to the load lock station. A third substrate is moved from a substrate processing chamber to the cooling station. Preferably, after the third substrate is moved to the cooling station, the first substrate is moved from the staging shelf to the processing chamber. The second substrate is removed from the load lock chamber and the cycle is repeated.

24 Claims, 7 Drawing Sheets

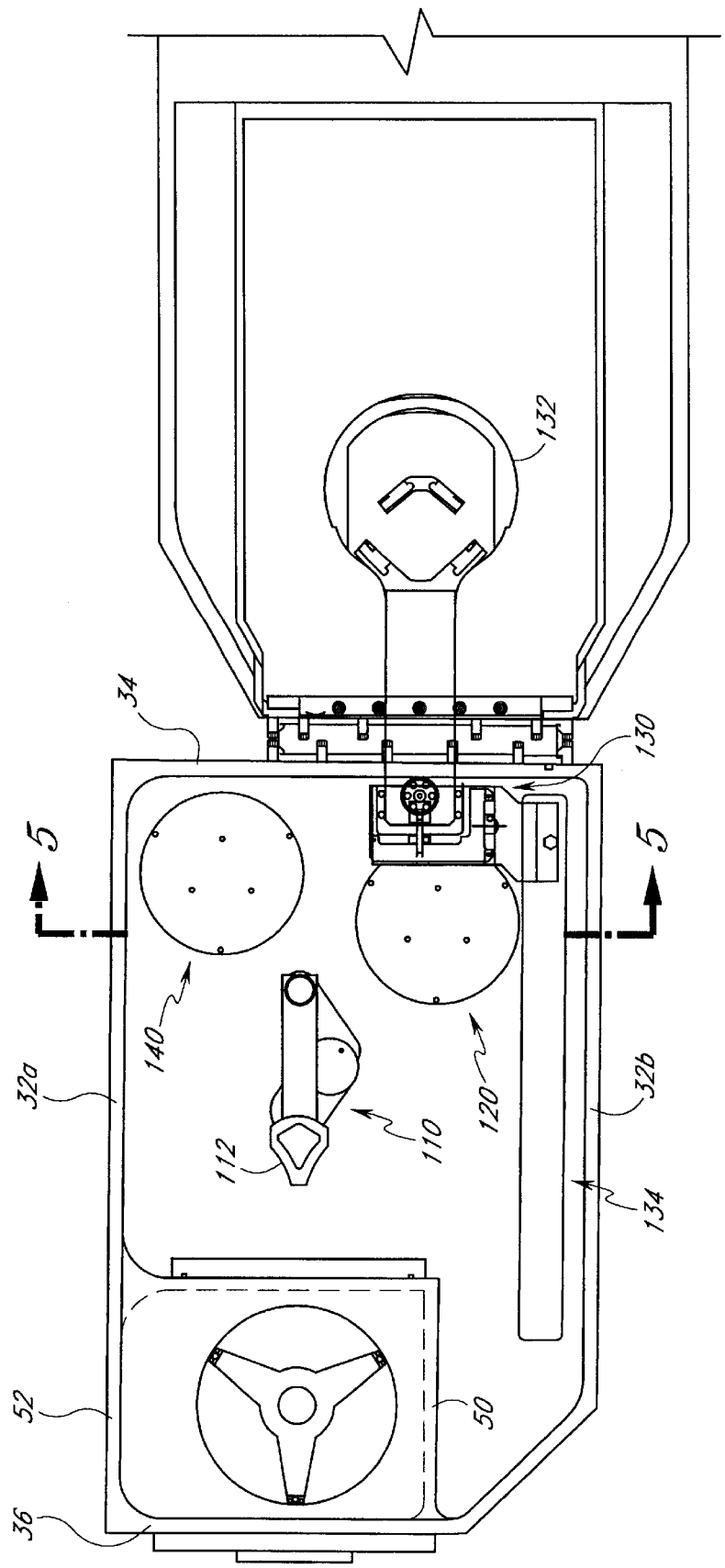

TRANSFER CHAMBER WITH INTEGRAL LOADLOCK AND STAGING STATION

BACKGROUND OF THE INVENTION

1. Field of the Invention

The present invention relates to a system and method for handling and processing semiconductor wafers and, in particular, to a transfer chamber with an integral load lock and staging station.

2. Description of the Related Art

In the processing of semiconductor devices, such as transistors, diodes, and integrated circuits, a plurality of such devices are fabricated simultaneously on a thin slice of semiconductor material, termed a substrate or wafer. When manufacturing these devices, it is imperative that the substrate does not become contaminated by particulate. Accordingly, substrate processing systems typically include a load lock apparatus that provides a substantially particle free environment from which substrates may be selectively withdrawn by a substrate handling assembly for placement into one or more processing modules.

There are several general problems that are associated with prior art substrate processing systems. For example, the addition of a load lock to a substrate processing system tends to increase the footprint of the substrate processing station. However, it generally is more desirable to reduce the footprint of the substrate processing system. Another general problem associated with prior art substrate systems is that when the substrate is removed from the one or more processing modules it typically is very hot (e.g., from 500° to 1200° C.). Accordingly, the substrate usually is allowed to cool before/after it is removed from the substrate processing system. This cooling time tends to decrease the throughput of the substrate processing system.

SUMMARY OF THE INVENTION

A need, therefore, exists for a substrate processing system with a load lock that has a reduced footprint and allows the substrate to cool after processing without significantly reducing throughput.

Accordingly, one aspect of the present invention involves a substrate processing system comprising a substrate handling chamber and a load lock chamber. The load lock chamber has a gated inlet for the transfer of a substrate into and out of the load lock chamber and a gated port for transferring a substrate between the load lock chamber and the substrate handling chamber. A staging shelf is positioned above the load lock chamber in the substrate handling chamber. The substrate processing system further includes a first substrate handler in the substrate handling chamber for moving a substrate between the load lock chamber and the staging shelf.

Another aspect of the present invention involves a method for processing semiconductor substrates. In the method, a first substrate is placed at a load lock station that is located inside a load lock. The first substrate is moved from the load lock station to a staging shelf located inside a substrate handling chamber. A second substrate is moved from a cooling station in the substrate handling chamber to the load lock station. A third substrate is moved from a substrate processing chamber to the cooling station. The first substrate is moved from the staging shelf to the processing chamber.

Yet another aspect of the present invention involves a substrate processing system that comprises a substrate handling chamber. A load lock port is located in a wall of the substrate handling chamber for the transfer of a substrate from a load lock chamber to the substrate handling chamber. Within the substrate handling chamber are a staging shelf, a rest station, a cooling station. The system also includes a first substrate handler configured to move the substrate to and from the load lock chamber, the staging shelf, the rest station and the cooling station.

Still yet another aspect of the present invention involves a substrate processing system that comprises a substrate handling chamber. A load lock port is located in a wall of the substrate handling chamber and is for transferring a substrate from a load lock chamber into the substrate handling chamber. The system includes a first substrate handler configured to rotate, extend and retract to move substrates to and from one or more positions within the substrate handling chamber. The system also includes a second substrate handler positioned on a fixed track and including a Bernoulli wand for straight line movement to move a substrate into and out of a substrate processing chamber adjacent the substrate handling chamber. The first substrate handler and the second substrate handler are configured such that a substrate can be positioned by the first substrate handler within the substrate handling chamber beneath the Bernoulli wand to transfer the substrate between the first substrate handler and the second substrate handler.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2A is a top plan view of the substrate processing system of FIG. 1 with a second substrate handler in a first position;

DETAILED DESCRIPTION OF THE PREFERRED EMBODIMENT

Figure 1:
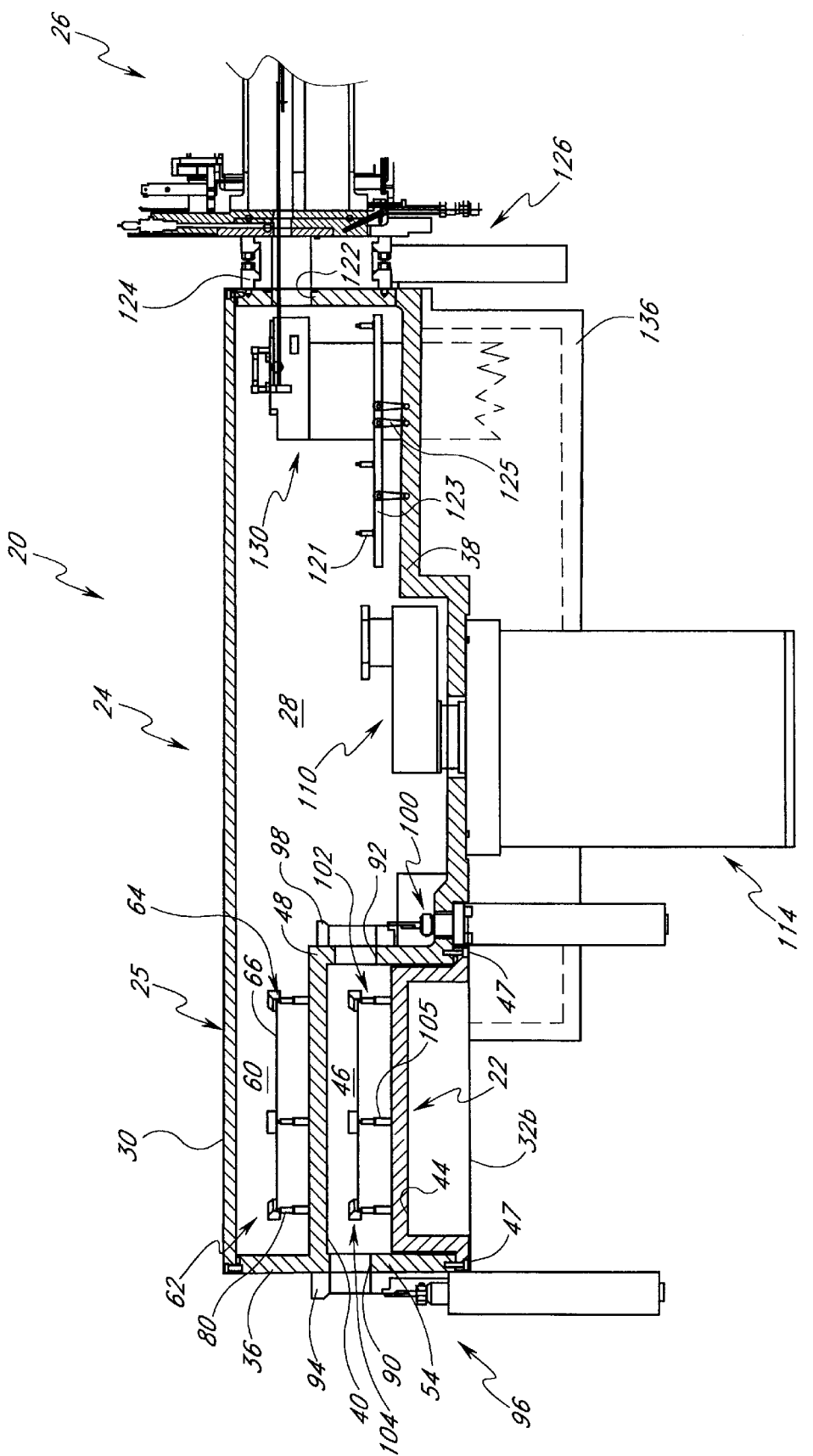
FIG. 1 is a cross-sectional view of a substrate processing system having certain features and aspects according to the present invention and which includes a substrate transfer module, an integral load lock and a substrate processing module.
Figure 2B:
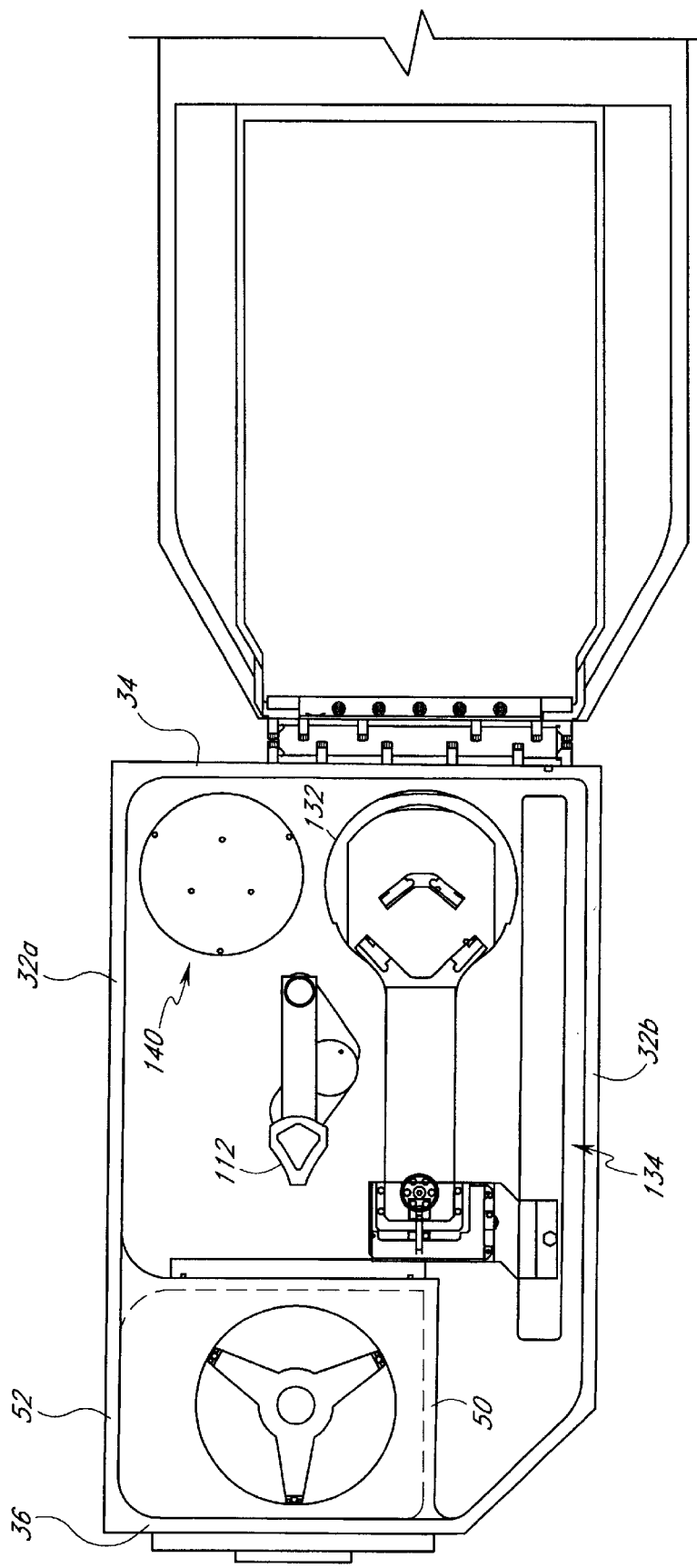
FIG. 2B is a top plan view of the substrate processing system of FIG. 1 with a second substrate handler in a second position.

FIGS. 1–2B illustrate a substrate processing system 20 including a load lock 22, a substrate handling module 24 and a substrate processing module 26.

Figure 3:
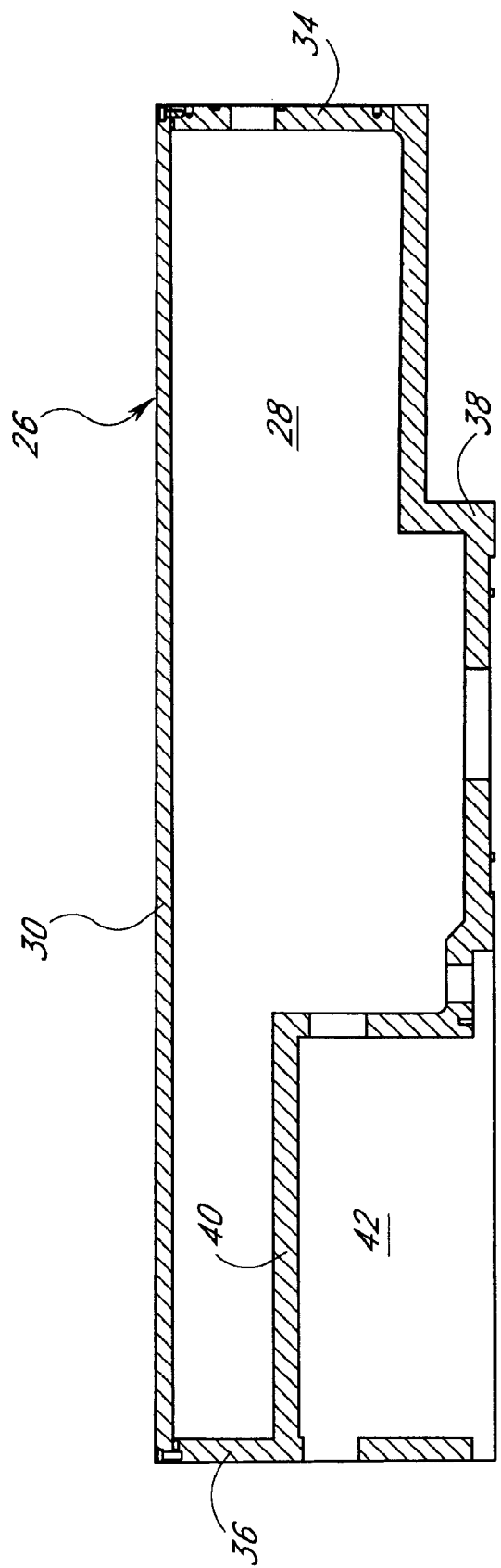
FIG. 3 is a cross-sectional view of a housing of the substrate transfer module.

With initial reference to FIGS. 1, 2A and 3, the substrate handling module 24 comprises a housing 25, which defines a substrate handling chamber 28. The housing 25, in the illustrated arrangement, includes a top wall 30, two vertically extending side walls 32a, 32b, a vertically extending rear wall 34, a vertically extending front wall 36 and a bottom wall 38.

The load lock 22 preferably is formed integrally with the substrate handling module 24. That is, the housing 25 of the substrate handling module preferably forms at least one wall of the load lock 22. More preferably, at least a top wall 40 of the load lock is defined by the housing 25 of the substrate handing module 24. Most preferably, as in the illustrated arrangement, the bottom wall 38, the front wall 36, and one of the vertically extending side walls 32a of the substrate handling module 34 define a recess 42 (see FIG. 3). With particular reference to FIG. 1, the recess 42 is enclosed by a bottom wall 44 thereby forming a load lock chamber 46. The bottom wall 44 preferably is attached to the housing 25 by a plurality of bolts 47. Accordingly, in the illustrated arrangement, the bottom wall 38 of the substrate handling module 24 forms the top wall 40, a rear wall 48, and a side wall 50 of the load lock 22. Moreover, a portion of the vertically extending side wall 32a and a portion of the front wall 36 preferably define another side wall 52 and a front wall 54, respectively, of the load lock 22. It should be noted, however, that certain features and advantages of the present invention can be achieved in an arrangement wherein the load lock 22 and the substrate handling module 24 do not share common walls (i.e., the top wall 40, the side walls 50, 52, and the rear wall 48 can be formed separate from the substrate handling module 24).

As mentioned above, in the illustrated arrangement, the top wall 40 of the load lock 22 is formed by the bottom wall 38 of the substrate handling module 24. Accordingly, as best seen in FIG. 1, a portion 60 of the substrate handling chamber 28 lies above the load lock 22. Preferably, a staging shelf 62 is provided within this portion 60 of the substrate handling chamber 28 for supporting a substrate. In the illustrated arrangement, the staging shelf 62 is configured to support a substrate carrier 64 (see FIG. 4), which will be described below. The substrate carrier 64, in turn, is configured to support a substrate 66.

Figure 4:
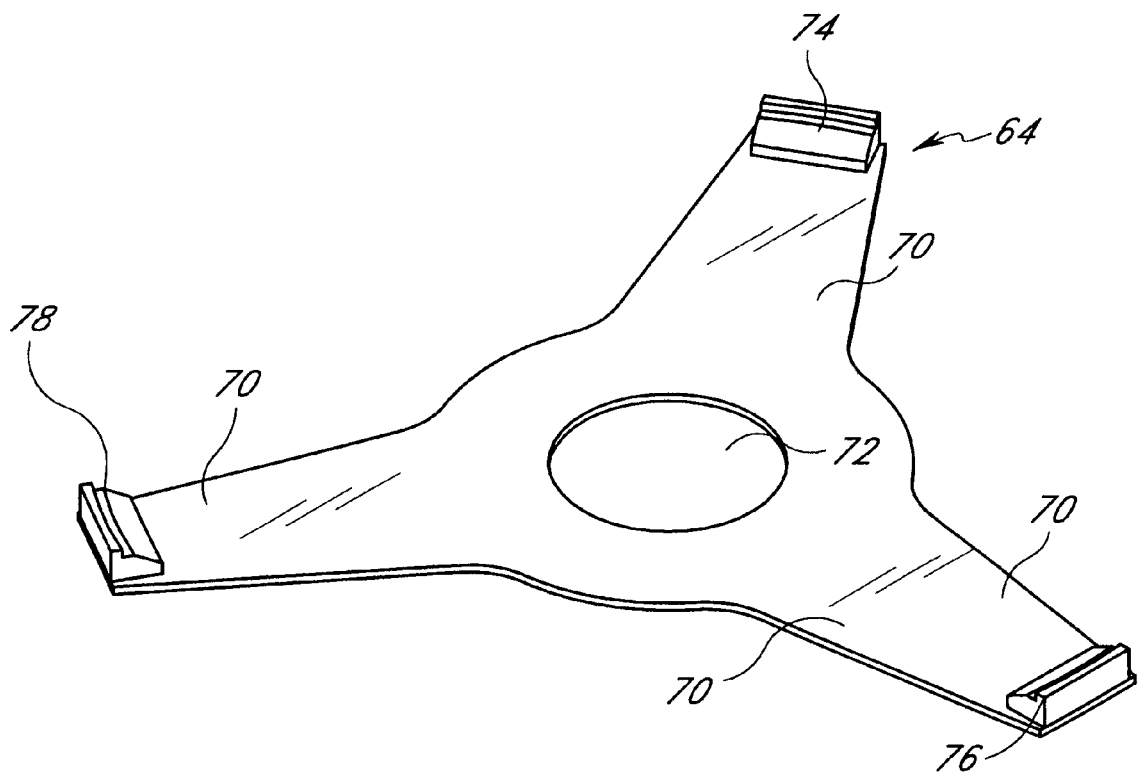
FIG. 4 is a perspective view of a substrate carrier.

The substrate carrier 44 is illustrated in FIG. 4 and is described detail in U.S. patent application Ser. No. 09/256, 743, which is herein expressly incorporated by reference. As will be describe below, the substrate carrier 64 is used for supporting the substrate 66 when it is moved to/from the load lock 22 and within the substrate handling module 24. However, it should be appreciated that several features and advantages of the present invention can be achieved without the use of a substrate carrier, such as the one illustrated in FIG. 4, for moving the substrate 66 within the substrate processing system 20. It should also be appreciated that the specific construction of the substrate carrier 64 is not an aspect of the present invention.

As shown in FIG. 4, the illustrated substrate carrier 64 includes a frame or structure formed by three flat arms 70 extending outward from its center and defining a generally flat wall. The substrate carrier 64 is preferably made of a metal such as aluminum, including anodized aluminum, or a ceramic such as alumina, or any other material that will not interfere with substrate processing. The carrier may have a hole 72 in its center to decrease its weight.

A support block 74 is connected to the outer end of each carrier arm 70. The substrate support blocks 74 define a horizontal substrate support plane. The substrate support block 74 is preferably made of quartz or a high temperature plastic. The illustrated block 74 includes a lip 76 at the top of the periphery, which restrains the substrate 66 from horizontal movement, and an upper support surface 78, which supports the substrate 66. The substrate support block 74 is sized such that only the portion of the substrate which will not be used, commonly known as the "exclusion zone," contacts the substrate support block 74.

In the illustrated arrangement, the staging shelf 62 includes a set of three spacers 80 (see FIG. 1), which support the substrate carrier 74 and extend upward from the top wall 40. In a modified arrangement, the spacers 80 can be connected to the substrate carrier 64 and configured to rest upon the top wall 40. The spacers 80 create a gap between the top wall 40 and the bottom of the carrier 64. As will be explained in more detail below, this gap allows the substrate carrier 64 to be picked up and moved without contacting the substrate 66. Of course, the staging shelf 62 can be formed in a variety of other ways giving due consideration to the preference for supporting a substrate carrier 64 such at the one illustrated in FIG. 4 or a substrate carrier of another configuration. It also should be noted that the several features and advantages of the present invention can be achieved in a processing system 20 that does not utilize a substrate carrier 64. In such an arrangement, the staging shelf 62 can be configured to directly support the substrate 66 within the portion 60 of the substrate handling chamber 28 that lies above the load lock 22.

With reference to FIG. 1, the illustrated load lock 22 includes a load lock port 90, which preferably is located in the front wall 54, and a substrate handling chamber port 92, which is located on the rear wall 48 and is in communication with the substrate handling chamber 28. The load lock port 90 is sufficiently large to allow transport of a substrate 66 therethrough. The illustrated substrate handling chamber port 92 is sufficiently large to allow transport of a substrate carrier 66, such as the one described above.

The load lock port 90 can be selectively covered by a load lock port gate 94, which is actuated by a load lock gate mechanism 96. In a similar manner, the handling chamber port 92 can be selectively opened and closed by a handling chamber gate 98, which is actuated by an assembly chamber gate mechanism 100. Theses components 94, 96, 98, 100 are conventional and thus a detail description is not necessary.

The load lock 22 preferably also includes a purge gas inlet (not shown), to which a purge gas valve (not shown) is connected. The purge gas inlet and the purge gas valve are configured to provide purge gas to the load lock chamber 46. The purge gas is removed from the load lock chamber 46 through a purge gas outlet (not shown) that is preferably located at the lower region of the load lock 22. The purge gas valve, inlet and outlet are conventional substrate processing components that are well known in the art.

With continued reference to FIG. 1, the load lock 22 preferably includes a load lock station 102. The load lock station 102 preferably is configured to support a substrate carrier 104, which, in the illustrated arrangement, is substantially identical to the substrate carrier 64 described above. Correspondingly, the illustrated load lock station 102 is substantially identical to the staging shelf 62 described above. Accordingly, the illustrated load lock station 102 comprises a set of three spacers 105 that extend upward from the bottom wall 44. Of course, the load lock station shelf 102 can be formed in a variety of other ways, giving due consideration to the preference for supporting the substrate carrier 104. Moreover, as mentioned above, certain arrangements of the present invention do not use a substrate carrier. In such arrangements, the load lock station 102 can be arranged to directly support a substrate.

With reference back to FIGS. 1 and 2A, a first substrate handler, which is indicated generally by the reference number 110, is positioned within the substrate handling chamber 28. Preferably, the first substrate handler 110 is configured to move a substrate carrier between the load lock station 102 and the staging shelf 62. Accordingly, the substrate handler 110 includes a simple paddle 112 that is configured to fit between a substrate carrier and the top wall 40 or bottom wall 44 respectively. This allows the substrate handler 110 to pick up a substrate carrier and move a substrate positioned on the substrate carrier without touching the substrate. Of course, as mentioned above, several features and advantages of the present invention can be achieved without utilizing a substrate carrier. In such arrangements, the paddle 112 can be configured, as is well known in the art, so as to pick up a substrate directly. Movement of the first substrate handler 110 is controlled by a driver 114 such that the paddle 112 can be moved horizontally and preferably vertically within the substrate handling chamber 28. The driver 114 is preferably controlled by a computer (not shown), as is well known in the art.

Figure 5:
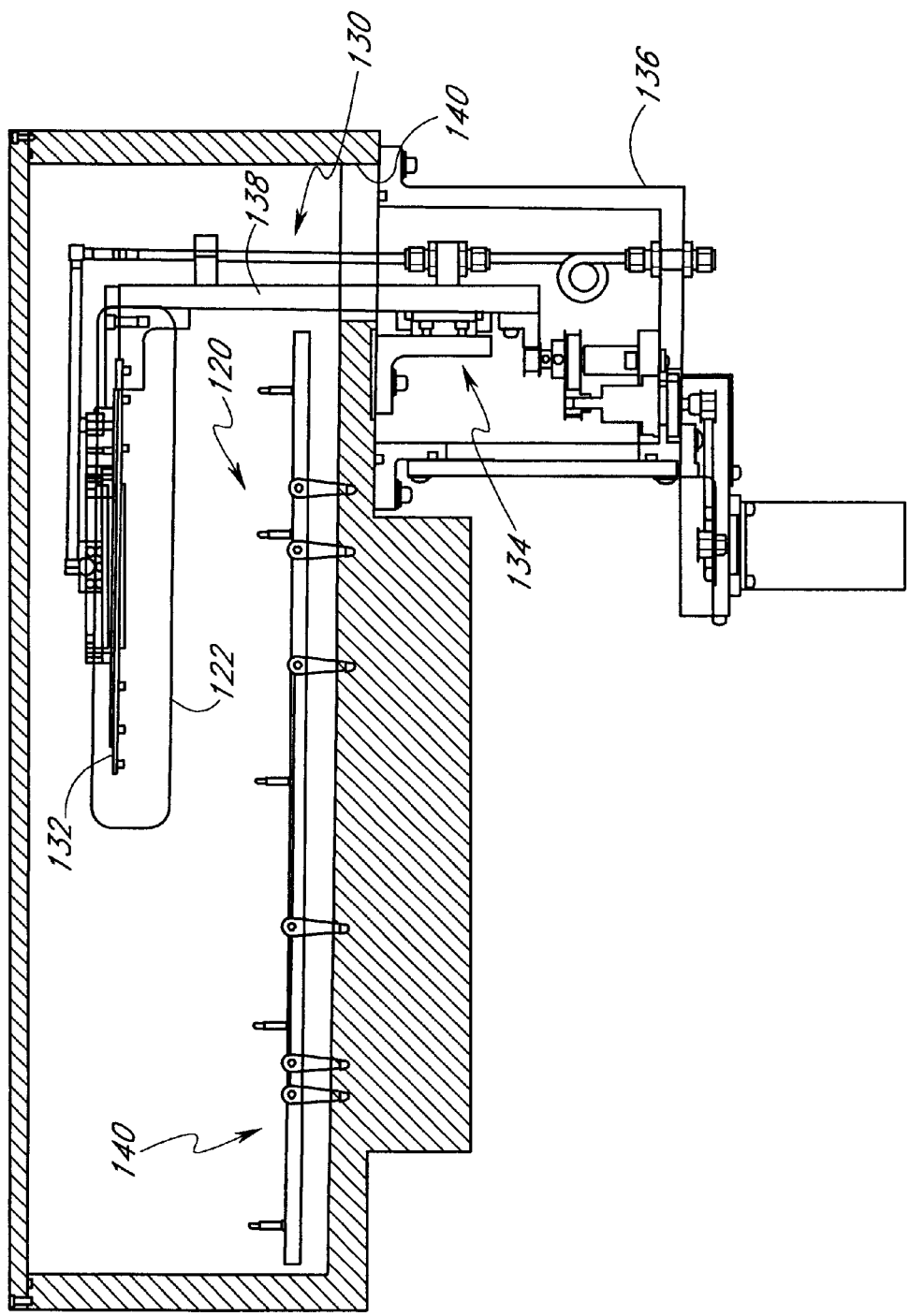
FIG. 5 is another cross-sectional view of the substrate processing system taken along line 5—5 of FIG. 2A.

With reference to FIGS. 1, 2A and 5, the substrate handling module 24 preferably includes a substrate rest station 120. The substrate rest station 120 preferably is configured to support a substrate carrier in a manner that is substantially similar to the manner described above. Accordingly, the substrate rest station 120 includes a set of three spacers 121 for supporting a substrate carrier (not shown). In the illustrated arrangement, the spacers 121 for the rest station 120 are supported by a base plate 123 that is supported within the substrate handling chamber 28 by a set of supports 125. Of course, as mentioned above, several features and advantages of the present invention can still be achieved if the substrate rest station 120 is (i) configured differently or (ii) configured to support a substrate directly. For example, the spacers 121 can be configured to extend directly from the lower wall 38 of the substrate handling module 24.

The substrate handling module 24 also includes a processing chamber port 122 that communicates with the adjacent processing chamber 26. In the illustrated arrangement, the processing chamber port 122 is selectively opened and closed by a processing chamber gate 124 (FIG. 1), which is actuated by a processing chamber gate mechanism 126. Preferably, the substrate rest station 120 is located in the substrate handling module 24 such that it lies adjacent to the processing chamber port 122. More preferably, as best seen in FIG. 5, the substrate rest station 120 is aligned with the processing chamber port 122. That is, the substrate rest station 120 and the processing chamber port 122 preferably are centered about the same vertical plane. Most preferably, the substrate rest station 120 and the load lock station 102 also have the same elevation (see FIG. 1).

The substrate handling module 24 preferably further includes a second substrate handler, which is indicated generally by the reference number 130. The second substrate handler 130 is configured to move a substrate between the substrate handling chamber 28 and the processing chamber 26. The second substrate handler 130 preferably includes a Bernoulli wand 132, which lifts a substrate from above without contacting the upper surface of the substrate, such as, for example, the wand disclosed in U.S. Pat. No. 4,951,601, which is herein expressly incorporated by reference.

Movement of the second substrate handler 130 is controlled by a driving mechanism, which is indicated generally by the reference number 134 (see FIG. 5). In the illustrated arrangement, the driving mechanism 134 is positioned in a driving mechanism housing 136, which preferably lies beneath the substrate handling module 24. The wand 132 preferably is connected to the driving mechanism 134 by an arm 138 that extends through an opening 140 formed in the lower wall 38 of the substrate handling module 24 (see FIG. 5). The driving mechanism 134 is preferably controlled by a computer (not shown), as is well known in the art.

The second substrate handler 130 is configured to move, at least, between a first position, which is illustrated in FIG. 2A and a second position which is illustrated in FIG. 2B. In the first position, the wand 132 of the second substrate handler 130 is located in the processing chamber 26. In the second position, the wand 132 is located above the substrate rest station 120 (see also FIG. 5). Therefore, to move a substrate from the substrate handling module 24 to the processing station 26, the first substrate handler 110 positions a substrate carrier supporting a substrate below the wand 132 of the second substrate handler 130 when the substrate handler 130 is in the second position. The wand 132 of the second substrate handler 130 then lifts the substrate from the substrate carrier, and the substrate is transferred laterally through the processing chamber port 122 and into the processing chamber 26, wherein the substrate is deposited to be processed. The substrate carrier is then set down at the rest station 120. U.S. patent application Ser. No. 09/006,325 filed Jan. 15, 1998, which is incorporated herein by reference, illustrates the transfer of a substrate between a paddle and a Bernoulli wand.

After the substrate is processed, the substrate is removed from the processing chamber 26 by the second substrate handler 130, which can withstand high temperatures, and is transferred to the substrate carrier, which has been lifted by the first substrate handler 110 from the rest station 120. Because the substrate is hot, it is desirable to cool the substrates before removing the substrate from the processing system 20. Therefore, as best seen in FIGS. 2A and 5, the substrate handling module 24 preferably also includes a cooling station 140, wherein the substrate carrier and a hot substrate can be transferred after processing. The cooling station 140 preferably is configured to support a substrate carrier. As best seen in FIGS. 1 and 5, the cooling station 140 preferably is located to a side of the rest station 120 and at the same elevation as the rest station 120. In the illustrated arrangement, the cooling station 140 is configured substantially identical to the rest station 120. Of course, as mentioned above, several features and advantages of the present invention can still be achieved if the cooling station 140 is (i) configured differently or (ii) configured to support a substrate directly.

FIGS. 6A–H schematically illustrate the movement of substrates and substrate carriers within the illustrated processing system 20 in accordance with certain aspects and advantages of the present invention. Substrates are indicated by the symbols "S1", "S2" and "S3" respectively. In a similar manner, substrate carriers are indicated by the symbols "C1", "C2" and "C3" respectively.

Figure 6A:
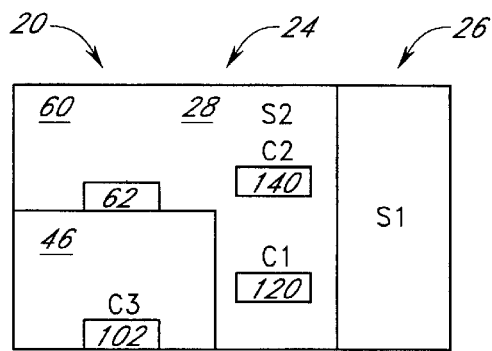
FIGS. 6A–6H are a schematic representations of a method for handling and processing substrates having certain features and advantages according to the present invention.

With initial reference to FIG. 6A, a first substrate S1 is in the process module 26, preferably, being processed. An empty first substrate carrier C1 is located at the rest station 120. In the cooling station 140, a second substrate S2 and a second substrate carrier C2 are positioned. Preferably, as will become apparent below, the second substrate S2 is a substrate that has recently been processed in the processed module 26. An empty third substrate carrier C3 sits in the load lock station 102 and the staging shelf 62 is empty.

Figure 6B:
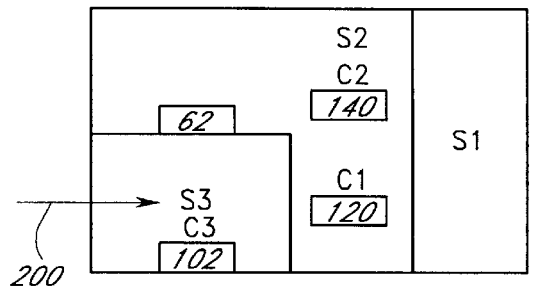

As shown in FIG. 6B, a robot (not shown) preferably places a third substrate S3 into the load lock chamber 46 and onto the substrate carrier C3 as indicated by the arrow 200.

Once the third substrate S3 is in place, the load lock 22 can be closed (e.g., by closing the load lock port 90) and the load lock 22 can be purged.

Figure 6C:
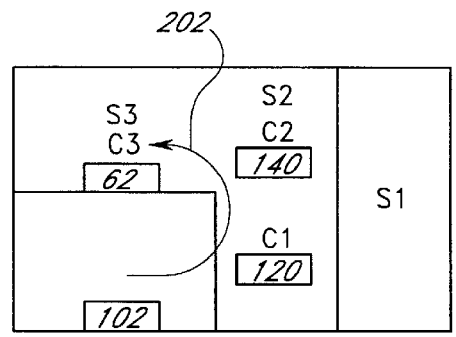
Figure 6D:
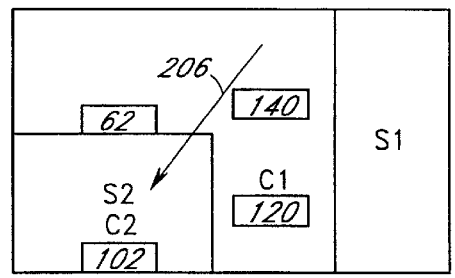
Figure 6E:
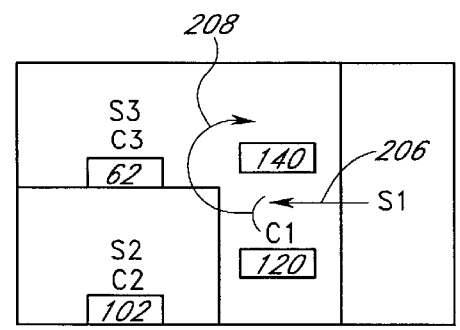

After the load lock 22 is purged, the substrate handling port 92 is opened and the first substrate handler 110 moves the third substrate carrier C3 and third substrate S3 to the staging shelf 62 as indicated by arrow 202 (see FIG. 6C). The first substrate handler 110 preferably then moves the second substrate carrier C2 and second substrate S2 from the cooling station 140 to the load lock station 102 as indicated by arrow 206 in FIG. 6D. Preferably, while the second substrate carrier C2 and second substrate S2 are in the load lock, the second substrate handler 130 removes the first substrate S1 from the processing module 26 and positions the first substrate S1 generally above the rest station 120 (see arrow 206 in FIG. 6E). The first substrate handler 110 then lifts the first substrate carrier C1 from the rest station 120 and the first substrate S1 is transferred to the first substrate carrier C1. The substrate handler 110 then moves the first substrate carrier C1 and first substrate S1 to the cooling station 140 as indicated by arrow 208 (FIG. 6E).

Figure 6F:
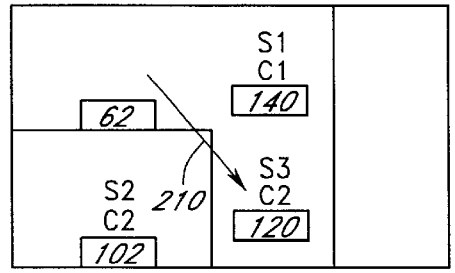
Figure 6G:
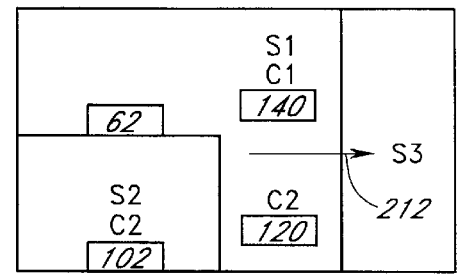
Figure 6H:
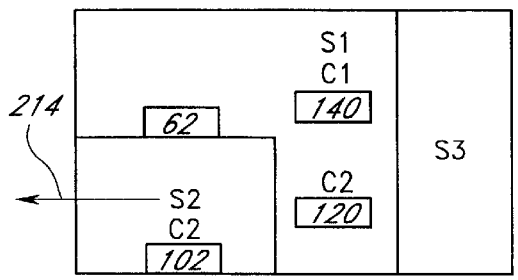

With reference now to FIG. 6F, after the first substrate carrier C1 and first substrate S1 are placed on the cooling station 140, the first substrate handler 110 moves the third substrate carrier C3 and the third substrate S3 to a position just below the second position of the second substrate handler 130 as indicated by arrow 210. The third substrate S3 can then be transferred from the third substrate carrier C3 to the second substrate handler 130. As shown in FIG. 6G, the second substrate handler 130 can then move the third substrate S3 to the processing chamber so that it can be processed as indicated by arrow 212.

As shown in FIG. 6F, at this point in the process, the first substrate S1 is cooling at the cooling station 140 while the third substrate S3 is being processed in the processing module. The second substrate S2, which has been processed and cooled is in the load lock 22. The second substrate S2 can now be removed from the load lock 22 by the robot as indicated by arrow 214. Preferably, this, of course, is done after the handling chamber port 92 is closed. An unprocessed substrate (not shown) can then be placed on the second substrate carrier S2 and the process described above can be repeated.

It should be appreciated that certain advantages and features of the present invention can be achieved in an arrangement wherein the cooling station 140 and the staging self 62 are interchanged. That is, staging shelf 62 can be used as the location wherein a substrate rests after being processed in the processing module (i.e., the step illustrated in FIG. 6E). In a similar manner, the cooling station can be used as the location wherein an unprocessed substrate is stored after being removed from the load lock (i.e., the step illustrated in FIG. 6C). However, the illustrated arrangement is preferred because it requires less movement of the first substrate handler 110.

It should also be appreciated that certain advantages and features of the present invention can be achieved in an arrangement wherein certain steps of the method described above are re-ordered. For example, with respect to the steps illustrated in FIGS. 6F, 6G and 6H, the second substrate S2 can be removed from the load lock 22 before the third substrate S3 is moved from the staging shelf 62 and transferred to the processing chamber. The illustrated arrangement, however, is preferred because it provides more time for the second substrate S2 to cool before it is removed from the processing system 20.

The arrangements described above have several advantages over the prior art. For example, because a portion 60 of the substrate handling chamber 28 lies above the load lock 22, the load lock 22 does not increase the footprint of the substrate processing system 20. That is, because the staging shelf 62 is positioned above the load lock 22, the overall size of the substrate processing station 20 is reduced.

Another advantage of the present invention is that a cooling period is provided for cooling a processed substrate before it is removed from the processing system 20. Moreover, the cooling period has little or no effect on the throughput of the processing system. Specifically, as described above, the processed substrate can cool at the cooling station 140 while the following occurs: (i) a substrate is loaded into the processing module 26, (ii) a processed substrate is removed from the load lock 22 (iii) an unprocessed substrate is added to the load lock, (iv) the load lock 22 is purged and (v) the substrate carrier and unprocessed substrate in the load lock are moved to the staging shelf 6.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A substrate processing system comprising:
    a substrate handling chamber;
    a load lock chamber having a gated inlet for the transfer of a substrate into and out of the load lock chamber, and having a gated port for transferring a substrate between the load lock chamber and the substrate handling chamber;
    a staging shelf in the handling chamber positioned above the load lock chamber;
    a first substrate handler in the substrate handling chamber for moving a substrate between the load lock chamber and the staging shelf;

a rest station within the handling chamber that is accessible by the first substrate handler and a gated port adjacent the rest station for the transfer of substrates between the rest station and an adjacent process chamber; and a second substrate handler in the substrate handler chamber for moving the substrate between a position above the rest station and a position within the process chamber.

2. The substrate processing system of claim 1, wherein the first substrate handler is configured to pass the substrate to the second substrate handler at the position above the rest station.

3. The substrate processing system of claim 2, wherein the elevation of the staging shelf is approximately the level of the position above the rest station where a substrate is passed from the first substrate handler to the second substrate handler.

4. The substrate processing system claim 1, including a cooling station within the substrate handler chamber accessible by the first substrate handler.

5. A substrate processing system comprising:

a substrate handling chamber;

a load lock chamber having a gated inlet for the transfer of a substrate into and out of the load lock chamber, and having a gated port for transferring a substrate between the load lock chamber and the substrate handling chamber;

a staging shelf in the handling chamber positioned above the load lock chamber; and a first substrate handler in the substrate handling chamber for moving a substrate between the load lock chamber and the staging shelf further comprising a rest station within the handling chamber that is accessible by the first substrate handler and a gated port adjacent the rest station for the transfer of substrates to an adjacent process chamber; and a cooling station within the substrate handler chamber accessible by the first substrate handler, wherein the elevation in the cooling station at which a substrate is positioned is approximately the same as that of the elevation at which a substrate is positioned within the load lock chamber.

6. The substrate processing system of claim 5, wherein the elevation of the rest station is approximately the same as the elevation of the cooling station.

7. A substrate processing system comprising:

a substrate handling chamber;

a load lock chamber having a gated inlet for the transfer of a substrate into and out of the load lock chamber, and having a gated port for transferring a substrate between the load lock chamber and the substrate handling chamber;

a staging shelf in the handling chamber positioned above the load lock chamber; and a first substrate handler in the substrate handling chamber for moving a substrate between the load lock chamber and the staging shelf;

wherein the staging shelf is supported on an upper wall of the load lock chamber.

8. A substrate processing system comprising:

a substrate handling chamber;

a load lock chamber having a gated inlet for the transfer of a substrate into and out of the load lock chamber, and having a gated port for transferring a substrate between the load lock chamber and the substrate handling chamber;

a staging shelf in the handling chamber positioned above the load lock chamber; and a first substrate handler in the substrate handling chamber for moving a substrate between the load lock chamber and the staging shelf;

wherein the load lock chamber is defined by a bottom wall that mates with a recessed area formed in a bottom wall of the substrate handler chamber.

9. A substrate processing system comprising:

a substrate handling chamber;

a load lock chamber having a gated inlet for the transfer of a substrate into and out of the load lock chamber, and having a gated port for transferring a substrate between the load lock chamber and the substrate handling chamber;

a staging shelf in the handling chamber positioned above the load lock chamber; and a first substrate handler in the substrate handling chamber for moving a substrate between the load lock chamber and the staging shelf, wherein the substrate handling chamber comprises a housing having a bottom wall and at least one vertically extending side wall, and the bottom wall and portions of said side wall form a recess that forms an upper wall and portions of a side wall of the load lock chamber.

10. A method of processing semiconductor substrates comprising:

placing a first substrate at a load lock station that is located inside a load lock;

moving the first substrate from the load lock station to a staging shelf located above the load lock station and inside a substrate handling chamber;

moving a second substrate from a cooling station in the substrate handling chamber to the load lock station;

moving a third substrate from a substrate processing chamber to the cooling station; and moving the first substrate from the staging shelf to the processing chamber.

11. The method of claim 10, wherein moving the first substrate from the load lock to the staging shelf includes moving a first substrate carrier from the load lock to the staging shelf with the substrate positioned on the carrier.

12. The method of claim 10, wherein moving the third substrate from the substrate processing module to the cooling station includes removing the third substrate from the processing module with a second substrate handler and transferring the third substrate from the second substrate handler to a first substrate handler.

13. The method of claim 12, wherein transferring the third substrate from the second substrate handler to the second substrate handler occurs generally over a rest station.

14. The method of claim 10, wherein moving the first substrate from the staging shelf to the processing chamber includes transferring the first substrate from a first substrate handler to a second substrate handler.

15. The method of claim 14, wherein transferring the first substrate from the first substrate handler to the second substrate handler occurs generally over the rest station.

16. The method of claim 10, further comprising moving the third substrate from the cooling station to the load lock and removing the third substrate from the load lock.

17. A method of processing semiconductor substrates comprising:

placing a first substrate at a load lock station that is located inside a load lock;

moving the first substrate from the load lock station to a staging shelf located inside a substrate handling chamber;

moving a second substrate from a cooling station in the substrate handling chamber to the load lock station;

moving a third substrate from a substrate processing chamber to the cooling station; and moving the first substrate from the staging shelf to the processing chamber;

wherein moving the third substrate from the substrate processing module to the cooling station includes removing the third substrate from the processing module with a second substrate handler and transferring the third substrate from the second substrate handler to a first substrate handler and wherein moving the third substrate from the substrate processing module to the cooling station further includes picking up a third substrate carrier from a rest station with the first substrate handler and placing the substrate on the third substrate carrier with the second substrate handler.

18. A method of processing semiconductor substrates comprising:

placing a first substrate at a load lock station that is located inside a load lock;

moving the first substrate from the load lock station to a staging shelf located inside a substrate handling chamber;

moving a second substrate from a cooling station in the substrate handling chamber to the load lock station;

moving a third substrate from a substrate processing chamber to the cooling station; and moving the first substrate from the staging shelf to the processing chamber;

wherein moving the third substrate from the substrate processing module to the cooling station includes removing the third substrate from the processing module with a second substrate handler and transferring the third substrate from the second substrate handler to a first substrate handler and wherein moving the first substrate from the staging shelf to the processing chamber further includes moving a first substrate carrier with the first substrate from staging shelf station and placing the first substrate carrier at the rest station after the first substrate has been transferred to the second substrate handler.

19. The method of claim 18, wherein moving the first substrate from the staging shelf to the processing chamber occurs before removing the third substrate from the load lock.

20. A substrate processing system comprising a substrate handling chamber, a load lock port in a wall of the substrate handling chamber for the transfer of a substrate from a load lock chamber to the substrate handling chamber, a staging shelf, a rest station, a cooling station all within the substrate handling chamber, a first substrate handler configured to move the substrate to and from the load lock chamber, the staging shelf, the rest station and the cooling station and a second substrate handler within the substrate handling chamber that includes a paddle with a Bernoulli wand configured to pickup a substrate from the first substrate handler and move the substrate from the substrate handling chamber through a processing chamber port in a wall of the substrate handling chamber and into a substrate processing chamber.

21. The substrate processing system of claim 20, further comprising three substrate carriers that are configured to support substrates, the first substrate handler being configured to move the substrate carriers between the load lock, the staging shelf, the rest station and the cooling station.

22. A substrate processing system comprising a substrate handling chamber, a load lock port in a wall of the substrate handling chamber for transferring a substrate from a load lock chamber into the substrate handling chamber, a first substrate handler configured to rotate, extend and retract to move substrates to and from one or more positions within the substrate handling chamber and a second substrate handler positioned on a fixed track and including a Bernoulli wand for straight line movement to move a substrate into and out of a substrate processing chamber adjacent the substrate handling chamber, the first substrate handler and the second substrate handler configured such that a substrate can be positioned by the first substrate handler within the substrate handling chamber beneath the Bernoulli wand to transfer the substrate between the first substrate handler and the second substrate handler.

23. The substrate processing system of claim 22, wherein the first substrate handler is also configured to move in a vertical direction as well as horizontal directions.

24. The substrate processing system of claim 22, wherein the first substrate handler is configured to move a substrate carrier with a substrate positioned on the substrate carrier and the second substrate handler is arranged to lift a substrate from a substrate carrier.

* * * * *